US009184246B2

(12) United States Patent
Ishibashi

(10) Patent No.: US 9,184,246 B2
(45) Date of Patent: *Nov. 10, 2015

(54) SILICON CARBIDE SUBSTRATE, SEMICONDUCTOR DEVICE, AND METHODS FOR MANUFACTURING THEM

(71) Applicant: SUMITOMO ELECTRIC INDUSTRIES, LTD., Osaka-shi, Osaka (JP)

(72) Inventor: Keiji Ishibashi, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 66 days.

This patent is subject to a terminal disclaimer.

(21) Appl. No.: 13/776,890

(22) Filed: Feb. 26, 2013

(65) Prior Publication Data

US 2013/0256700 A1 Oct. 3, 2013

Related U.S. Application Data

(60) Provisional application No. 61/618,928, filed on Apr. 2, 2012.

(30) Foreign Application Priority Data

Apr. 2, 2012 (JP) .................................. 2012-083610

(51) Int. Cl.
*H01L 29/32* (2006.01)
*H01L 21/02* (2006.01)
(Continued)

(52) U.S. Cl.
CPC ................ *H01L 29/32* (2013.01); *C30B 29/36* (2013.01); *C30B 31/04* (2013.01);
(Continued)

(58) Field of Classification Search
USPC ........ 257/77, 76, 78, 347; 438/694; 117/4, 89
See application file for complete search history.

(56) References Cited

U.S. PATENT DOCUMENTS 6,053,973 A * 4/2000 Tanino et al. ...................... 117/4
6,530,991 B2 * 3/2003 Tanaka et al. .................... 117/89
(Continued)

FOREIGN PATENT DOCUMENTS

CN 1623894 A 6/2005
CN 1892984 A 1/2007
(Continued)

OTHER PUBLICATIONS

R.C. Glass et al., "SiC Seeded Crystal Growth," Phys. Stat. sol. (b) 202, 1997, pp. 149-162.
(Continued)

*Primary Examiner* — Matthew Reames
*Assistant Examiner* — Vincent Wall
(74) *Attorney, Agent, or Firm* — Drinker Biddle & Reath LLP

(57) ABSTRACT

A silicon carbide substrate has a first main surface, and a second main surface opposite to the first main surface. A region including at least one main surface of the first and second main surfaces is made of single-crystal silicon carbide. In the one main surface, sulfur atoms are present at not less than $60 \times 10^{10}$ atoms/cm$^2$ and not more than $2000 \times 10^{10}$ atoms/cm$^2$, and carbon atoms as an impurity are present at not less than 3 at % and not more than 25 at %. Thereby, a silicon carbide substrate having a stable surface, a semiconductor device using the substrate, and methods for manufacturing them can be provided.

11 Claims, 4 Drawing Sheets

(51) Int. Cl.
    *C30B 29/36*       (2006.01)
    *C30B 31/04*       (2006.01)
    *H01L 29/66*       (2006.01)
    *H01L 29/812*     (2006.01)
    *H01L 29/16*       (2006.01)

(52) U.S. Cl.
    CPC ... *H01L 21/02002* (2013.01); *H01L 21/02008* (2013.01); *H01L 21/02019* (2013.01); *H01L 21/02024* (2013.01); *H01L 21/02378* (2013.01); *H01L 29/66068* (2013.01); *H01L 29/812* (2013.01); *H01L 29/1608* (2013.01)

(56) References Cited

U.S. PATENT DOCUMENTS

| | | | |
|---|---|---|---|
| 8,058,174 B2* | 11/2011 | Narendar et al. | 438/694 |
| 2001/0012678 A1 | 8/2001 | Tanaka et al. | |
| 2003/0080384 A1* | 5/2003 | Takahashi et al. | 257/347 |
| 2006/0234058 A1 | 10/2006 | Ohmi et al. | |
| 2008/0197360 A1 | 8/2008 | Sriram et al. | |
| 2011/0031589 A1 | 2/2011 | Ishibashi | |
| 2011/0156058 A1 | 6/2011 | Hori et al. | |
| 2013/0020585 A1* | 1/2013 | Ishibashi | 257/77 |

FOREIGN PATENT DOCUMENTS

| | | |
|---|---|---|
| CN | 101336473 A | 12/2008 |
| CN | 101536192 A | 9/2009 |
| JP | 09-301799 A | 11/1997 |
| JP | 10-194896 A | 7/1998 |
| JP | 2003-282451 A | 10/2003 |
| JP | 2005-47753 A | 2/2005 |
| JP | 200547753 A | 2/2005 |
| JP | 2006-327931 A | 12/2006 |
| JP | 2008-174841 A | 7/2008 |
| JP | 2009-188100 A | 8/2009 |
| JP | 2010-163307 A | 7/2010 |
| JP | 2011-071204 A | 4/2011 |
| JP | 2011-77381 | 4/2011 |
| WO | WO 2010/090024 A1 | 8/2010 |

OTHER PUBLICATIONS

Office Action issued Jul. 29, 2015 in Chinese Patent Application No. 201280030621.3 (6 pages) with English Translation (9 pages).

* cited by examiner

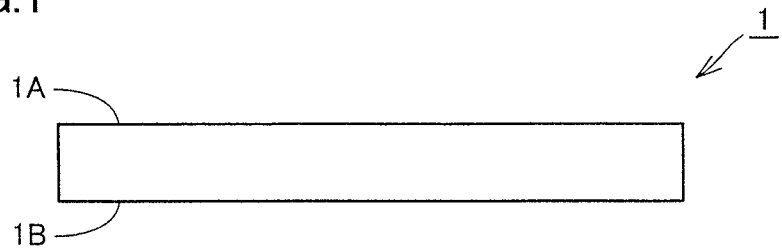
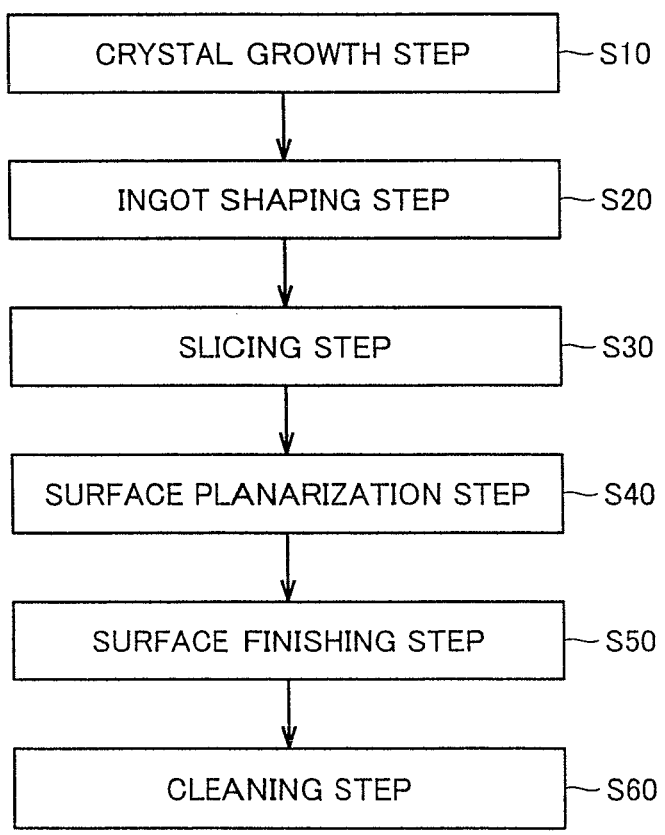

SILICON CARBIDE SUBSTRATE, SEMICONDUCTOR DEVICE, AND METHODS FOR MANUFACTURING THEM

This application claims the benefit of U.S. Provisional Application No. 61/618,928 filed Apr. 2, 2012, which is incorporated by reference herein in the entirety.

BACKGROUND OF THE INVENTION

1. Field of the Invention

The present invention relates to a silicon carbide substrate, a semiconductor device, and methods for manufacturing them. More particularly, the present invention relates to a silicon carbide substrate capable of improving yield of semiconductor device characteristics, a semiconductor device using the substrate, and methods for manufacturing them.

2. Description of the Background Art

In recent years, in order to achieve higher breakdown voltage and lower loss of a semiconductor device, use thereof in a high temperature environment, and the like, silicon carbide has increasingly been adopted as a material for forming a semiconductor device. Since silicon carbide is excellent in heat conductivity when compared with a semiconductor made of a nitride such as gallium nitride, it is excellent as a substrate for a semiconductor device for high-power application at high voltage and large current.

In order to form a high-quality epitaxial layer on a substrate, the substrate may be subjected to surface treatment before formation of the epitaxial layer. For example, Japanese Patent Laying-Open No. 2010-163307 describes a nitride substrate having a surface layer containing 3 atomic percent (at %) to 25 at % of carbon and $5 \times 10^{10}$ atoms/cm$^2$ to $200 \times 10^{10}$ atoms/cm$^2$ of a p type metal element. Thereby, a nitride substrate having a stabilized surface is obtained.

However, the state of a surface differs depending on the substrate material, resulting in differences in surface oxidation and easiness of adsorption or adherence of an impurity to the surface. Therefore, even if the method described in Japanese Patent Laying-Open No. 2010-163307 is applied to a silicon carbide substrate, it is difficult to obtain a silicon carbide substrate having a stabilized surface.

SUMMARY OF THE INVENTION

The present invention has been made to solve such a problem, and one object of the present invention is to provide a silicon carbide substrate having a stabilized surface, a semiconductor device using the substrate, and methods for manufacturing them.

The inventor of the present invention has studied the relationship between the state of a surface of a silicon carbide substrate and characteristics of a semiconductor device using the substrate. As a result, the inventor has found that the characteristics of the semiconductor device are influenced by the presence of an impurity element in a main surface of the silicon carbide substrate on which an epitaxial growth layer is to be formed. The inventor has also obtained a finding that the characteristics of the semiconductor device differ depending on the type of the impurity element.

Specifically, when there are many impurities in the surface of the silicon carbide substrate, epitaxial growth is inhibited because lattice matching with the substrate is hindered. Further, when a native oxide film is formed on the surface of the silicon carbide substrate from oxygen in an atmosphere, the quality of an epitaxial layer grown by lattice matching with the substrate is deteriorated. In addition, silicon (Si) as an impurity from the atmosphere is likely to adhere to the surface of the silicon carbide substrate. When silicon is increased, a piled-up layer is formed at an interface between the silicon carbide substrate and the epitaxial layer, reducing a resistance at the interface. When the resistance at the interface is reduced, a current leaks toward the substrate, causing deterioration in the characteristics of the semiconductor device. In particular, the deterioration in the characteristics of the semiconductor device due to the leakage current is more significant in a lateral semiconductor device.

As a result of earnest study, the inventor has obtained the following findings. Due to the presence of certain amounts of sulfur atoms and carbon atoms as an impurity in the surface of the silicon carbide substrate, oxidation of the surface and an increase in impurities are suppressed, and thereby deterioration in the quality of the epitaxial layer formed on the surface can be suppressed. In addition, due to the presence of certain amounts of sulfur atoms and carbon atoms as an impurity in the surface of the silicon carbide substrate, silicon as an impurity is suppressed from adhering to the surface of the silicon carbide substrate. Thus, a reduction in the resistance at the interface between the silicon carbide substrate and the epitaxial layer can be suppressed. As a result, yield of a semiconductor device manufactured using the silicon carbide substrate can be improved.

As described above, it has been found that, due to the presence of certain amounts of sulfur atoms and carbon atoms as an impurity in the surface of the silicon carbide substrate, the surface of the silicon carbide substrate is stabilized, and yield of a semiconductor device formed using the substrate can be improved.

A silicon carbide substrate in accordance with the present invention has a first main surface, and a second main surface opposite to the first main surface. A region including at least one main surface of the first and second main surfaces is made of single-crystal silicon carbide. Sulfur atoms are present in the one main surface at not less than $60 \times 10^{10}$ atoms/cm$^2$ and not more than $2000 \times 10^{10}$ atoms/cm$^2$, and carbon atoms as an impurity are present in the one main surface at not less than 3 at % and not more than 25 at %.

According to the silicon carbide substrate in accordance with the present invention, the presence ratio of the sulfur atoms in the one surface is not less than $60 \times 10^{10}$ atoms/cm$^2$ and not more than $2000 \times 10^{10}$ atoms/cm$^2$, and the presence ratio of the carbon atoms as the impurity in the one surface is not less than 3 at % and not more than 25 at %. Since the presence ratio of the sulfur atoms is not less than $60 \times 10^{10}$ atoms/cm$^2$ and the presence ratio of the carbon atoms as the impurity is not less than 3 at %, the silicon carbide substrate has a stabilized surface. In addition, since the presence ratio of the sulfur atoms is not more than $2000 \times 10^{10}$ atoms/cm$^2$ and the presence ratio of the carbon atoms as the impurity is not more than 25 at %, inhibition of epitaxial growth due to hindered lattice matching with the substrate can be suppressed. As a result, a silicon carbide substrate capable of improving yield of a semiconductor device can be provided.

It is noted that the presence ratio of the sulfur atoms in the main surface of the silicon carbide substrate can be measured for example by TXRF (Total Reflection X-Ray Fluorescence) or the like. Further, the presence ratio of the carbon atoms in the main surface of the silicon carbide substrate can be measured by AES (Auger Electron Spectroscopy), XPS (X-ray Photoelectron Spectroscopy), or the like. In the measurement by these analysis methods, the presence ratio of an impurity element is measured based on information in a region from the main surface to a depth of about 5 nm. That is, in the present application, the presence ratio of an element in the main surface of the silicon carbide substrate means the presence ratio of the element in a region from the main surface to a depth of about 5 nm. It is noted that, since XPS evaluates binding energy, it can separately evaluate carbon constituting silicon carbide and carbon contained in an organic substance and the like adhering to a surface, that is, carbon as an impurity. Specifically, by observing peak shift (chemical shift) in XPS spectra, carbon detected at about 281 to 283 eV is determined as carbon of Si—C, and carbon detected at about 284 to 293 eV is determined as carbon as an impurity adhering to a surface of a substrate.

The carbon atoms as the impurity refer to, for example, carbon atoms adhering to the silicon carbide substrate, as an impurity. In other words, the carbon atoms as the impurity refer to carbon atoms not having silicon carbide binding. Examples of the carbon atoms as the impurity include carbon atoms in a bound state such as C—C, C—H, C=C, C—OH, or O=C—OH.

Preferably, in the silicon carbide substrate, chlorine atoms are present in the one main surface at not more than $3000 \times 10^{10}$ atoms/cm$^2$. Thereby, deterioration in the quality of an epitaxial growth layer can be suppressed. Further, the silicon carbide substrate has a stabilized surface. As a result, a silicon carbide substrate capable of improving yield of a semiconductor device can be provided.

It is noted that the presence ratio of the chlorine atoms in the main surface of the silicon carbide substrate can be measured for example by TXRF or the like.

Preferably, in the silicon carbide substrate, oxygen atoms are present in the one main surface at not less than 3 at % and not more than 30 at %. Since the presence ratio of the oxygen atoms is not less than 3 at %, the silicon carbide substrate has a stabilized surface. Further, since the presence ratio of the oxygen atoms is not more than 30 at %, deterioration in the quality of the epitaxial growth layer can be suppressed. As a result, a silicon carbide substrate capable of improving yield of a semiconductor device can be provided.

It is noted that the presence ratio of the oxygen atoms in the main surface of the silicon carbide substrate can be measured by AES, XPS, or the like.

Preferably, in the silicon carbide substrate, a metal impurity is present in the one main surface at not more than $4000 \times 10^{10}$ atoms/cm$^2$. Thereby, deterioration in the quality of the epitaxial growth layer can be suppressed. Further, the silicon carbide substrate has a stabilized surface. As a result, a silicon carbide substrate capable of improving yield of a semiconductor device can be provided.

It is noted that the presence ratio of the metal impurity in the main surface of the silicon carbide substrate can be measured for example by TXRF or the like.

Preferably, in the silicon carbide substrate, the one main surface has a surface roughness of not more than 0.5 nm when evaluated in a root-mean-square roughness Rq (see the Japanese Industrial Standards: JIS). This allows easy formation of a good-quality epitaxial growth layer on the one main surface. As a result, a silicon carbide substrate capable of improving yield of a semiconductor device can be provided.

It is noted that the surface roughness of the main surface can be measured for example with an AFM (Atomic Force Microscope), an optical interference-type roughness meter, a stylus-type roughness meter, or the like.

Preferably, the silicon carbide substrate has a diameter of not less than 110 mm. In a process for manufacturing a semiconductor device using such a large-diameter substrate, manufacturing efficiency of the semiconductor device can be improved, and manufacturing cost thereof can be suppressed.

Preferably, the silicon carbide substrate has a diameter of not less than 125 mm and not more than 300 mm. From the viewpoint of improving productivity, a large-area substrate having a diameter of approximately 125 mm or more is desired. If the substrate has a diameter of more than 300 mm, in-plane distribution of the surface impurities is increased. Further, advanced control is required to suppress warpage of the substrate. Thus, it is desirable that the silicon carbide substrate has a diameter of not more than 300 mm.

Preferably, in the silicon carbide substrate, the single-crystal silicon carbide has a 4H structure. The one main surface has an off angle of not less than 0.1° and not more than 10° relative to a {0001} plane of the single-crystal silicon carbide.

Silicon carbide having a 4H structure, which is hexagonal silicon carbide, can be efficiently grown by being grown in a <0001> direction. In addition, a substrate having a small off angle, specifically, an off angle of not more than 10°, relative to the {0001} plane can be efficiently fabricated from a crystal grown in the <0001> direction. On the other hand, good epitaxial growth is easily performed by providing the one main surface with an off angle of not less than 0.1° relative to the {0001} plane.

Preferably, in the silicon carbide substrate, the single-crystal silicon carbide has a 4H structure. The one main surface has an off angle of not more than 4° relative to a {03-38} plane of the single-crystal silicon carbide.

Thereby, suppression of leakage current, improvement in channel mobility, and the like in a semiconductor device manufactured using the substrate are easily achieved.

The silicon carbide substrate has a base layer, and a single-crystal silicon carbide layer formed on the base layer. The one main surface is a surface of the single-crystal silicon carbide layer on a side opposite to a side facing the base layer.

Thereby, a silicon carbide substrate can be manufactured relatively inexpensively for example by preparing an inexpensive base substrate, specifically, a substrate made of single-crystal silicon carbide having a high defect density, a polycrystalline silicon carbide substrate, or a base substrate made of ceramics, as a base layer, and arranging a substrate made of a good-quality silicon carbide single crystal on the base substrate. In particular, since it is difficult to obtain a large-diameter silicon carbide substrate, an inexpensive, large-diameter silicon carbide substrate can be obtained for example by arranging a plurality of single-crystal silicon carbide substrates which have good quality but are small in size on a base substrate, side by side when viewed in plan view, to fabricate a silicon carbide substrate having a plurality of single-crystal silicon carbide layers arranged side by side on a base layer along a main surface of the base layer.

A semiconductor device in accordance with the present invention has a silicon carbide substrate, an epitaxial growth layer, and an electrode. The silicon carbide substrate has a first main surface, and a second main surface opposite to the first main surface. A region including at least one main surface of the first and second main surfaces of the silicon carbide substrate is made of single-crystal silicon carbide. Sulfur atoms are present in the one main surface at not less than $60 \times 10^{10}$ atoms/cm$^2$ and not more than $2000 \times 10^{10}$ atoms/cm$^2$, and carbon atoms as an impurity are present in the one main surface at not less than 3 at % and not more than 25 at %. The epitaxial growth layer is formed on the one main surface of the silicon carbide substrate. The electrode is formed on the epitaxial growth layer.

According to the semiconductor device in accordance with the present invention, since the presence ratio of the sulfur atoms is not less than $60 \times 10^{10}$ atoms/cm$^2$ and the presence ratio of the carbon atoms as the impurity is not less than 3 at %, the silicon carbide substrate has a stabilized surface. In addition, since the presence ratio of the sulfur atoms is not more than $2000 \times 10^{10}$ atoms/cm$^2$ and the presence ratio of the carbon atoms as the impurity is not more than 25 at %, inhibition of epitaxial growth due to hindered lattice matching with the substrate can be suppressed. As a result, yield of the semiconductor device can be improved.

A method for manufacturing a silicon carbide substrate in accordance with the present invention includes the steps of: preparing a crystal of single-crystal silicon carbide; obtaining a substrate having a first main surface and a second main surface opposite to the first main surface, by cutting the crystal; planarizing at least one main surface of the first and second main surfaces; and performing finishing treatment on a planarized surface of the substrate. In the step of performing finishing treatment on the surface of the substrate, presence ratios of sulfur atoms and carbon atoms as an impurity in the one main surface are adjusted such that the sulfur atoms are present in the one main surface at not less than $60 \times 10^{10}$ atoms/cm$^2$ and not more than $2000 \times 10^{10}$ atoms/cm$^2$, and the carbon atoms as the impurity are present in the one main surface at not less than 3 at % and not more than 25 at %.

According to the method for manufacturing a silicon carbide substrate in accordance with the present invention, a silicon carbide substrate capable of improving yield of a semiconductor device can be provided.

A method for manufacturing a semiconductor device in accordance with the present invention includes the steps of: preparing a silicon carbide substrate including a first main surface and a second main surface opposite to the first main surface, a region including at least one main surface of the first and second main surfaces of the silicon carbide substrate being made of single-crystal silicon carbide, sulfur atoms being present in the one main surface at not less than $60 \times 10^{10}$ atoms/cm$^2$ and not more than $2000 \times 10^{10}$ atoms/cm$^2$, and carbon atoms as an impurity being present in the one main surface at not less than 3 at % and not more than 25 at %; forming an epitaxial growth layer on the one main surface of the silicon carbide substrate; and forming an electrode on the epitaxial growth layer.

According to the method for manufacturing a semiconductor device in accordance with the present invention, yield of the semiconductor device can be improved.

As is clear from the above description, according to the silicon carbide substrate, the semiconductor device using the substrate, and the methods for manufacturing them in accordance with the present invention, a silicon carbide substrate having a stabilized surface, a semiconductor device using the substrate, and methods for manufacturing them can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic cross sectional view showing a structure of a silicon carbide substrate in a first embodiment.

FIG. 2 is a flowchart schematically showing a method for manufacturing the silicon carbide substrate in the first embodiment.

DESCRIPTION OF THE PREFERRED EMBODIMENTS

Figure 3:
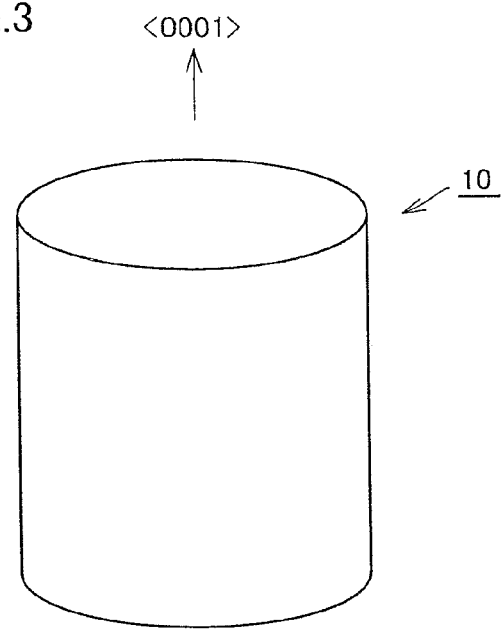
FIG. 3 is a schematic perspective view for illustrating the method for manufacturing the silicon carbide substrate in the first embodiment.

Hereinafter, embodiments of the present invention will be described with reference to the drawings. It is noted that in the below-mentioned drawings, the same or corresponding portions are given the same reference characters and are not described repeatedly. Further, in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

First Embodiment

First, a silicon carbide substrate as one embodiment of the present invention will be described. Referring to FIG. 1, a silicon carbide substrate 1 in the present embodiment is entirely made of single-crystal silicon carbide, and has a first main surface 1A and a second main surface 1B opposite to the first main surface. In at least one main surface of first and second main surfaces 1A and 1B (for example, first main surface 1A), sulfur atoms are present at not less than $60 \times 10^{10}$ atoms/cm$^2$ and not more than $2000 \times 10^{10}$ atoms/cm$^2$, and carbon atoms as an impurity are present at not less than 3 at % and not more than 25 at %.

Since the presence ratio of the sulfur atoms is not less than $60 \times 10^{10}$ atoms/cm$^2$ and the presence ratio of the carbon atoms as the impurity is not less than 3 at %, the silicon carbide substrate has a stabilized surface. In addition, since the presence ratio of the sulfur atoms is not more than $2000 \times 10^{10}$ atoms/cm$^2$ and the presence ratio of the carbon atoms as the impurity is not more than 25 at %, inhibition of epitaxial growth due to hindered lattice matching with the substrate can be suppressed. As a result, a silicon carbide substrate capable of improving yield of a semiconductor device can be provided.

The amount of the sulfur atoms present in the one main surface of silicon carbide substrate 1 is preferably not less than $80 \times 10^{10}$ atoms/cm$^2$ and not more than $800 \times 10^{10}$ atoms/cm$^2$, and more preferably not less than $120 \times 10^{10}$ atoms/cm$^2$ and not more than $600 \times 10^{10}$ atoms/cm$^2$.

The amount of the carbon atoms as the impurity present in the one main surface of silicon carbide substrate 1 is preferably not less than 7 at % and not more than 21 at %, and more preferably not less than 10 at % and not more than 18 at %.

Chlorine atoms are present in the one main surface of silicon carbide substrate 1 in accordance with the present embodiment at not more than 3000×10$^{10}$ atoms/cm$^2$. The amount of the chlorine atoms is preferably not more than 1300×10$^{10}$ atoms/cm$^2$, and more preferably not more than 100×10$^{10}$ atoms/cm$^2$. Thereby, a silicon carbide substrate capable of further improving yield of a semiconductor device can be provided.

Oxygen atoms are present in the one main surface of silicon carbide substrate 1 in accordance with the present embodiment at not less than 3 at % and not more than 30 at %. The amount of the oxygen atoms is preferably not less than 5 at % and not more than 21 at %, and more preferably not less than 9 at % and not more than 15 at %. Thereby, a silicon carbide substrate capable of further improving yield of a semiconductor device can be provided.

A metal impurity is present in the one main surface of silicon carbide substrate 1 in accordance with the present embodiment at not more than 4000×10$^{10}$ atoms/cm$^2$. The amount of the metal impurity is preferably not more than 900×10$^{10}$ atoms/cm$^2$, and more preferably not more than 80×10$^{10}$ atoms/cm$^2$. Examples of the metal impurity include Ti (titanium), Cr (chromium), Fe (iron), Ni (nickel), Cu (copper), Zn (zinc), Ca (calcium), K (potassium), Al (aluminum), and the like. By reducing the amount of the metal impurity, the quality of an epitaxial growth layer can be improved.

The one main surface of silicon carbide substrate 1 in accordance with the present embodiment has a surface roughness of not more than 0.5 nm when evaluated in Rq as a root-mean-square roughness (see the Japanese Industrial Standards: JIS). This allows easy formation of a high-quality epitaxial growth layer on the one main surface of silicon carbide substrate 1. As a result, a silicon carbide substrate capable of improving yield of a semiconductor device can be provided. Rq is preferably not more than 0.3 nm, and more preferably not more than 0.1 nm.

Preferably, silicon carbide substrate 1 has a diameter of not less than 110 mm. Using a large-area substrate leads to an increase in the number of chips to be obtained. Thereby, cost and productivity in a device process can be improved. Further, silicon carbide substrate 1 preferably has a diameter of not less than 125 mm and not more than 300 mm. From the viewpoint of improving productivity, a large-area substrate is desired. However, if the substrate has a diameter of more than 300 mm, in-plane distribution of the surface impurities is increased. Further, advanced control is required to suppress warpage of the substrate.

Preferably, the single-crystal silicon carbide forming the substrate has a 4H structure, and the one main surface has an off angle of not less than 0.1° and not more than 10° relative to a {0001} plane. Preferably, the one main surface is a surface that is off from a {000-1} plane by 0.01 to 5°.

Preferably, the single-crystal silicon carbide forming the substrate has a 4H structure, and the one main surface has an off angle of not more than 4° relative to a {03-38} plane. Preferably, the one main surface is a surface that is off from a {01-11} plane or a {01-12} plane by not more than 4°, or a surface that is off from a {0-33-8} plane, a {0-11-1} plane, or a {0-11-2} plane by not more than 4°. Thereby, a particularly good oxide film is obtained, and thus good characteristics are obtained in a semiconductor device such as a MOSFET (Metal Oxide Semiconductor Field Effect Transistor).

Next, a method for manufacturing silicon carbide substrate 1 will be described. Referring to FIG. 2, in the method for manufacturing silicon carbide substrate 1 in the present embodiment, first, a crystal growth step is performed as step (S10). In this step (S10), single-crystal silicon carbide is fabricated, for example, by a sublimation method described below.

First, a seed crystal made of single-crystal silicon carbide and source material powder made of silicon carbide are introduced into a container made of graphite. Subsequently, the source material powder is heated, and thereby silicon carbide is sublimated and recrystallized on the seed crystal. On this occasion, recrystallization proceeds while a desired impurity such as nitrogen is being introduced. Then, heating is stopped when a crystal of a desired size is grown on the seed crystal, and a crystal of single-crystal silicon carbide is taken out of the container.

Next, an ingot shaping step is performed as step (S20). In this step (S20), the crystal of single-crystal silicon carbide fabricated in step (S10) is processed into an ingot 10 having, for example, a cylindrical shape shown in FIG. 3. On this occasion, since growing hexagonal silicon carbide in the <0001> direction can efficiently promote crystal growth while suppressing occurrence of a defect, it is preferable to fabricate ingot 10 having a longitudinal direction corresponding to the <0001> direction as shown in FIG. 3.

Figure 4:
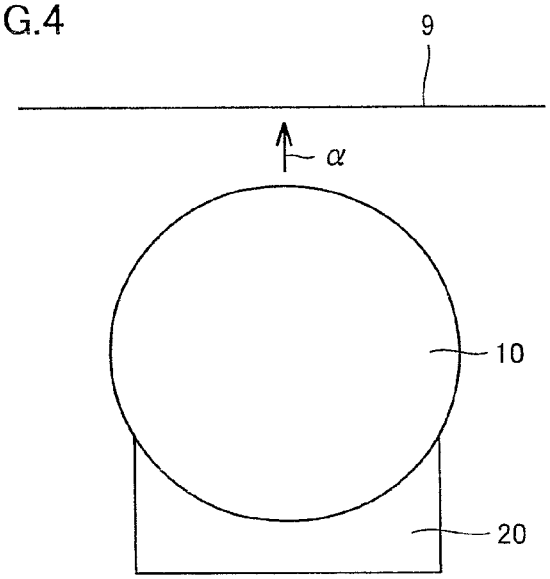
FIG. 4 is a schematic plan view for illustrating the method for manufacturing the silicon carbide substrate in the first embodiment.
Figure 5:
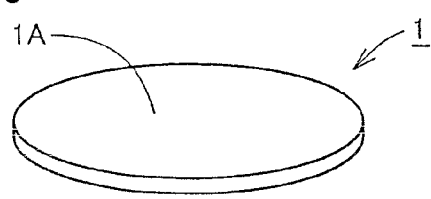
FIG. 5 is a schematic perspective view for illustrating the method for manufacturing the silicon carbide substrate in the first embodiment.

Next, a slicing step is performed as step (S30). In this step (S30), a substrate is fabricated by cutting ingot 10 obtained in step (S20). Specifically, referring to FIG. 4, first, fabricated columnar (cylindrical) ingot 10 is set such that a portion of its side surface is supported by a support 20. Subsequently, while a wire 9 is running in a direction along a direction of a diameter of ingot 10, ingot 10 approaches wire 9 along a cutting direction α perpendicular to the running direction, and thus ingot 10 comes into contact with wire 9. Then, ingot 10 keeps moving along cutting direction α, and thereby ingot 10 is cut. Thus, silicon carbide substrate 1 shown in FIG. 5 is obtained. On this occasion, ingot 10 is cut such that main surface 1A of silicon carbide substrate 1 has a desired plane orientation.

Next, a surface planarization step is performed as step (S40). In this step (S40), grinding processing, polishing processing, and the like are performed on main surface 1A of silicon carbide substrate 1 to reduce roughness of a cut surface formed in step (S30) (i.e., main surface 1A). In the grinding processing, a diamond grindstone is used as a tool, and the grindstone is set to face silicon carbide substrate 1 and rotated to cut into it at a constant speed, and thereby removes a surface of the substrate. Main surface 1A can be planarized by removing its unevenness, and its thickness can be adjusted. In the polishing processing, a desired surface roughness can be obtained by adjusting a grain size of abrasive grains of diamond or the like. As a surface plate, a surface plate made of a metal such as iron, copper, tin, a tin alloy, or the like, a composite surface plate made of a metal and a resin, or a polishing cloth can be used. Using a hard metal surface plate can improve a rate. Using a soft surface plate can reduce the surface roughness.

Next, a surface finishing step is performed as step (S50). In this step (S50), by performing dry etching, CMP (Chemical Mechanical Polishing), or the like on main surface 1A of silicon carbide substrate 1, the amounts of the sulfur atoms, the carbon atoms as the impurity, the chlorine atoms, the oxygen atoms, and the metal impurity that are present on the surface of the silicon carbide substrate, the surface roughness of the silicon carbide substrate, and the like can be controlled to be within desired ranges.

For example, while lapping, polishing, and the like can be used as a polishing method for controlling the surface roughness of the silicon carbide substrate, it is preferable to use CMP treatment to perform finish polishing in order to reduce the surface roughness and control surface composition. Abrasive grains for the CMP are required to be made of a material softer than silicon carbide in order to reduce the surface roughness and a process-damaged layer, and colloidal silica or fumed silica is preferable. A solution for the CMP preferably has a pH of not more than 4 or not less than 9.5, and more preferably has a pH of not more than 2 or not less than 10.5, to increase a chemical action thereof. The pH of the CMP solution can be controlled by adding: an inorganic acid such as hydrochloric acid, nitric acid, sulfuric acid, or phosphoric acid; an organic acid such as formic acid, acetic acid, oxalic acid, citric acid, malic acid, tartaric acid, succinic acid, phthalic acid, or fumaric acid; an inorganic alkali such as KOH, NaOH, or $NH_4OH$; an organic alkali such as choline, amine, or TMAH; or a salt thereof. Further, it is preferable to add an oxidant. As the oxidant, hypochlorous acid or a salt thereof, a chlorinated isocyanuric acid such as trichloroisocyanuric acid, a chlorinated isocyanurate such as sodium dichloroisocyanurate, a permanganate such as potassium permanganate, a dichromate such as potassium dichromate, a bromate such as potassium bromate, a thiosulfate such as sodium thiosulfate, nitric acid, sulfuric acid, hydrochloric acid, aqueous hydrogen peroxide, ozone, or the like can be used. The pH can also be controlled by adding the oxidant.

Sulfuric acid or sulfate is preferably used for pH adjustment, because it facilitates control of the amount of sulfur present in the surface of the silicon carbide substrate. In addition, an organic acid, an organic alkali, or a salt thereof is preferably used for pH adjustment, because it facilitates control of the amount of carbon present in the surface of the silicon carbide substrate. Examples of the organic acid include carboxylic acid, and examples of the organic alkali include choline, TMAH (tetramethylammonium hydroxide), and the like.

Aqueous hydrogen peroxide is preferably adopted as the oxidant, because it facilitates control of the amount of oxygen present in the surface of the silicon carbide substrate. The amount of chlorine present in the surface of the silicon carbide substrate can be controlled by using a chlorine-based oxidant. In order to control the composition of the surface of the silicon carbide substrate, control the surface roughness, and improve the rate, it is preferable to select x and y to satisfy $-50x+700 \leq y \leq -50x+1800$, where x represents a pH of the solution, and y represents an oxidation-reduction potential. By controlling the oxidation-reduction potential to be within an appropriate range to control oxidation power of the solution, the amount of oxygen in the surface of the silicon carbide substrate can be controlled, and the surface roughness and a polishing speed can be controlled to be within appropriate ranges.

In order to control the composition of the surface of the silicon carbide substrate, control the surface roughness, and improve the rate, it is preferable to set a resistance coefficient R ($m^2/s$), which is represented using a viscosity η (mPa·s) of a polishing liquid, a liquid flow rate Q ($m^3/s$), an area S ($m^2$) of the polishing surface plate, a polishing pressure P (kPa), and a peripheral speed V(m/s) (here, determined as R=η×Q× V/S×P), to $2.0 \times 10^{-15}$ to $8.0 \times 10^{-14}$. By controlling the resistance coefficient, a resistance applied to the substrate during polishing by friction between the polishing cloth and the substrate can be controlled. Further, the composition of the surface can be effectively controlled, and the surface roughness and the polishing speed can be controlled to be within appropriate ranges.

Regarding polishing of a back surface, it is preferable to finish the back surface by polishing using fine diamond abrasive grains. Although the CMP treatment can reduce surface roughness, there arise problems in terms of cost and productivity. The diamond abrasive grains preferably have a grain size of 0.1 μm to 3 μm. As a surface plate, a surface plate made of a metal such as tin, a tin alloy, or the like, a resin surface plate, or a polishing cloth can be used. Using a metal surface plate can improve a rate. Using a polishing cloth can reduce the surface roughness. In order to set the surface roughness within an appropriate range, it is preferable to set resistance coefficient R ($m^2/s$) to $1.0 \times 10^{-18}$ to $3.0 \times 10^{-17}$. By controlling the resistance coefficient, a resistance applied to the substrate during polishing by friction between the surface plate and the substrate can be uniformized all over the substrate and set within a range appropriate for finishing the surface, and in-plane distribution of the roughness can be reduced. The back surface is preferably has roughness Rq of 0.3 nm to 10 nm. A good epitaxial layer can be grown by stabilizing contact with a susceptor to uniformize temperature distribution during epitaxial growth, and suppressing warpage during heating.

Dry etching may be performed to control the amounts of the sulfur atoms, the carbon atoms as the impurity, the chlorine atoms, the oxygen atoms, and the metal impurity that are present on the surface of silicon carbide substrate 1, the surface roughness of silicon carbide substrate 1, and the like to be within desired ranges. For example, the amount of the sulfur atoms in the surface of silicon carbide substrate 1 can be controlled by using a sulfur-based gas such as hydrogen sulfide. The amount of the carbon atoms as the impurity in the surface of silicon carbide substrate 1 can be controlled by using a carbon-based gas such as methane, ethane, propane, or acetylene. The amount of the oxygen atoms in the surface of silicon carbide substrate 1 can be controlled by using oxygen gas. The amount of the chlorine atoms in the surface of silicon carbide substrate 1 can be controlled by using chlorine or a chlorine-based gas such as boron trichloride. In addition, the amount of carbon can also be controlled by etching and reducing silicon in the substrate using a chlorine-based gas or a fluorine-based gas.

Next, a cleaning step is performed as step (S60). In this step (S60), foreign matter adhering to the surface during the process up to step (S50) is removed by cleaning. The presence ratios of atoms such as the sulfur atoms and the carbon atoms in the surface of the silicon carbide substrate can be adjusted to be within the desired ranges, through selection of a chemical solution, application of ultrasound, overflow circulation of the chemical solution in a cleaning tank, and removal of particles using a filter in the cleaning step. As the chemical solution, an inorganic acid, an inorganic alkali, an organic acid, or an organic alkali can be used. An oxidant such as aqueous hydrogen peroxide can be used to enhance cleaning effect. The ultrasound can have a frequency of 50 kHz to 2 MHz. The filter for circulating the chemical solution preferably has a pore diameter of not less than 50 nm and not more than 5 μm. Through the above steps, silicon carbide substrate 1 in the present embodiment is completed.

According to the method for manufacturing silicon carbide substrate 1 in the present embodiment, in the step of performing finishing treatment on the surface of the substrate, the presence ratios of the sulfur atoms and the carbon atoms as the impurity in the one main surface are adjusted such that the sulfur atoms are present in the one main surface at not less than $60 \times 10^{10}$ atoms/$cm^2$ and not more than $2000 \times 10^{10}$ atoms/$cm^2$, and the carbon atoms as the impurity are present in the one main surface at not less than 3 at % and not more than 25 at %. Since the presence ratio of the sulfur atoms is not less than $60 \times 10^{10}$ atoms/$cm^2$ and the presence ratio of the carbon atoms as the impurity is not less than 3 at %, the silicon carbide substrate has a stabilized surface. In addition, since the presence ratio of the sulfur atoms is not more than $2000 \times 10^{10}$ atoms/$cm^2$ and the presence ratio of the carbon atoms as the impurity is not more than 25 at %, inhibition of epitaxial growth due to hindered lattice matching with silicon carbide substrate 1 can be suppressed. As a result, silicon carbide substrate 1 capable of improving yield of a semiconductor device can be provided.

Next, a semiconductor device in the present embodiment will be described.

Figure 6:
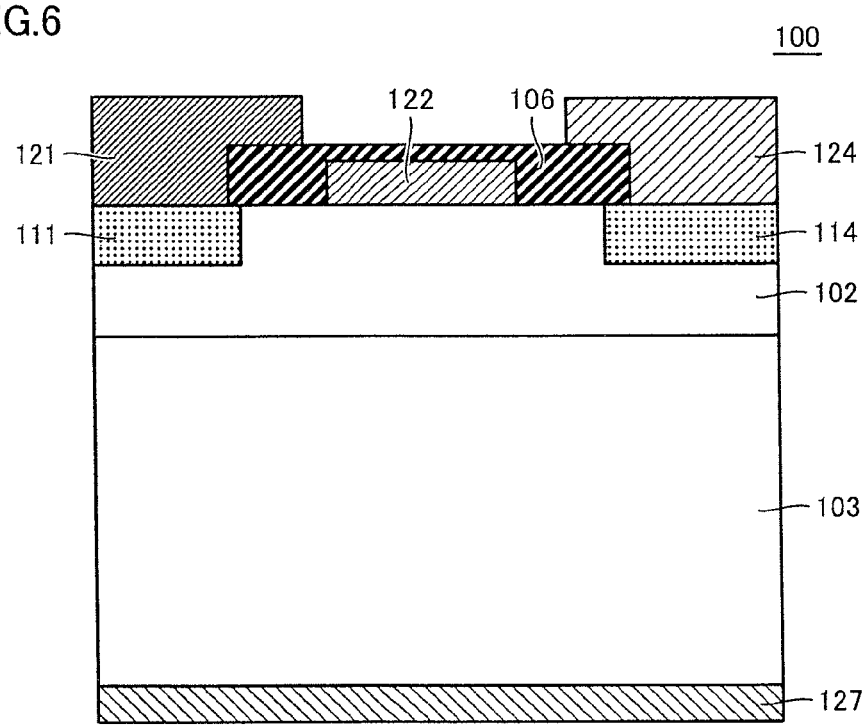
FIG. 6 is a schematic cross sectional view showing a structure of a lateral MESFET in the first embodiment.

Referring to FIG. 6, a lateral MESFET (Metal Semiconductor Field Effect Transistor) as a semiconductor device 100 in the present embodiment mainly has a p– type silicon carbide substrate 103 and an n– type silicon carbide epitaxial growth layer 102. The lateral MESFET includes an n+ type source impurity region 111 and an n+ type drain impurity region 114 in a region with a certain depth from a main surface of n– type silicon carbide epitaxial growth layer 102 on a side not facing p– type silicon carbide substrate 103 (an upper side in FIG. 6). A source electrode 121 and a drain electrode 124 are formed on upper main surfaces of n+ type source impurity region 111 and n+ type drain impurity region 114, respectively. A gate electrode 122 is formed between source electrode 121 and drain electrode 124. An interlayer insulating film 106 is arranged between source electrode 121 and gate electrode 122, and between gate electrode 122 and drain electrode 124. A substrate back-surface electrode 127 is arranged on a main surface of p– type silicon carbide substrate 103 on a side not facing n– type silicon carbide epitaxial growth layer 102 (a lower side in FIG. 6). It is noted that p type and n type of the components described above may be reversed.

For example, p– type silicon carbide substrate 103 is formed of p type silicon carbide. P– type means having a low p type impurity concentration, a high resistance, and semi-insulating properties. Specifically, p– type silicon carbide substrate 103 is made of a silicon carbide substrate having a thickness of not less than 100 μm and not more than 400 μm, and a concentration of boron atoms as an impurity of $1 \times 10^{15}$ cm$^{-3}$. Further, n– type silicon carbide epitaxial growth layer 102 is formed of an epitaxial layer having a low n type impurity concentration. Specifically, n– type silicon carbide epitaxial growth layer 102 has a thickness of about 1 μm, and a concentration of nitrogen atoms as an impurity of $1 \times 10^{17}$ cm$^{-3}$. In addition, n+ type source impurity region 111 and n+ type drain impurity region 114 are each formed of an n type injection layer. N+ type means having a high n type impurity concentration. Specifically, n+ type source impurity region 111 is an about 0.4 μm-thick n type injection layer containing about $1 \times 10^{19}$ cm$^{-3}$ of nitrogen atoms. An n– type silicon carbide substrate can contain nitrogen as an impurity. A p– type silicon carbide epitaxial growth layer can contain aluminum as an impurity.

Although the present embodiment has described the MESFET as exemplary semiconductor device 100, the semiconductor device is not limited thereto. Semiconductor device 100 may be, for example, a HEMT (High Electron Mobility Transistor), a lateral JFET (Junction Field Effect Transistor), a lateral MESFET, HFET (Heterojunction Field Effect Transistor), or the like.

Next, one example of a method for manufacturing the lateral MESFET as semiconductor device 100 in the present embodiment will be described.

Figure 7:
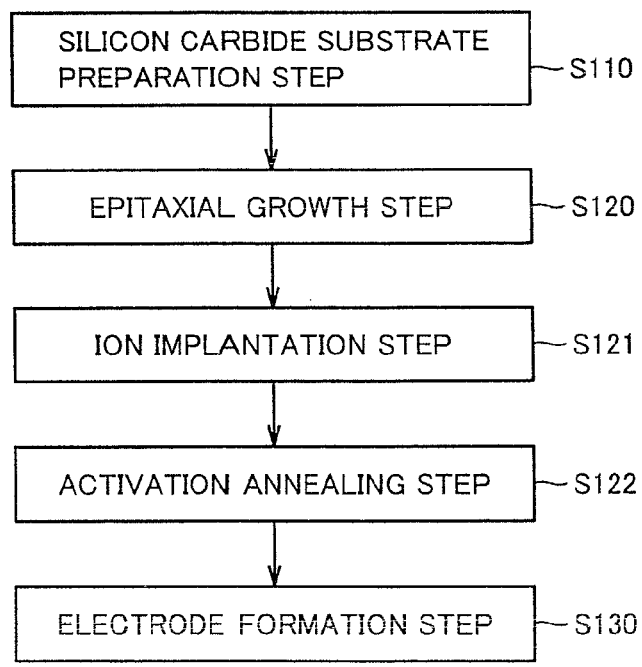
FIG. 7 is a flowchart schematically showing a method for manufacturing the lateral MESFET in the first embodiment.

Referring to FIG. 7, in the method for manufacturing the MESFET in the present embodiment, first, a silicon carbide substrate preparation step is performed as step (S110). In this step (S110), silicon carbide substrate 1 described above is prepared. Specifically, silicon carbide substrate 1 is prepared in which, in at least one main surface of the silicon carbide substrate, sulfur atoms are present at not less than $60 \times 10^{10}$ atoms/cm$^2$ and not more than $2000 \times 10^{10}$ atoms/cm$^2$, and carbon atoms as an impurity are present at not less than 3 at % and not more than 25 at %.

Next, an epitaxial growth step is performed as step (S120). Specifically, silicon carbide epitaxial growth layer 102 is formed on the one main surface in which the sulfur atoms are present at not less than $60 \times 10^{10}$ atoms/cm$^2$ and not more than $2000 \times 10^{10}$ atoms/cm$^2$, and the carbon, atoms as the impurity are present at not less than 3 at % and not more than 25 at %.

Next, an ion implantation step is performed as step (S121). In this step (S121), n+ type source impurity region 111 and n+ type drain impurity region 114 are formed by performing ion implantation on epitaxial growth layer 102 formed in step (S120).

Next, an activation annealing step is performed as step (S122). In this step (S122), for example, heat treatment for heating to about 1600° C. to 1900° C. is performed. Thereby, the impurity implanted in step (S121) is activated.

Next, an electrode formation step is performed as step (S130). In this step (S130), substrate back-surface electrode 127 is formed on a side of silicon carbide substrate 103 opposite to a side thereof on which silicon carbide epitaxial growth layer 102 is formed. Thereby, the MESFET as semiconductor device 100 is completed.

Next, function and effect of semiconductor device 100 and the method for manufacturing semiconductor device 100 in the present embodiment will be described.

In semiconductor device 100 and the method for manufacturing semiconductor device 100 in the present embodiment, silicon carbide substrate 1 having a stabilized surface is used. Thus, high-quality epitaxial growth layer 102 is formed on silicon carbide substrate 1. Further, formation of a low resistance layer at an interface between silicon carbide substrate 1 and epitaxial growth layer 102 can be suppressed. As a result, yield of semiconductor device 100 can be improved.

Second Embodiment

Figure 8:
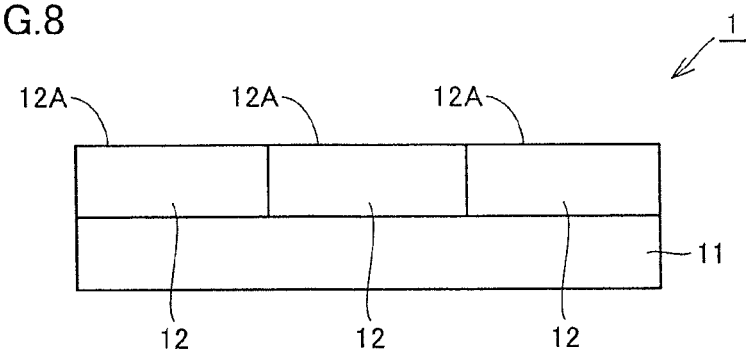
FIG. 8 is a schematic cross sectional view showing a structure of a silicon carbide substrate in a second embodiment.

Next, a silicon carbide substrate in a second embodiment will be described. Referring to FIG. 8, silicon carbide substrate 1 in the second embodiment basically has the same structure and exhibits the same effect as those of silicon carbide substrate 1 in the first embodiment. However, silicon carbide substrate 1 in the second embodiment is different from that in the first embodiment in that it includes a base layer 11 and a single-crystal silicon carbide layer 12.

Specifically, referring to FIG. 8, silicon carbide substrate 1 in the second embodiment includes base layer 11, and single-crystal silicon carbide layer 12 formed on base layer 11. Further, a main surface 12A of single-crystal silicon carbide layer 12 on a side opposite to a side facing base layer 11 corresponds to main surface 1A in the first embodiment. That is, in silicon carbide substrate 1 in the present embodiment, a region including one main surface 12A is made of single-crystal silicon carbide. The presence ratio of sulfur atoms in one main surface 12A is not less than $60 \times 10^{10}$ atoms/cm$^2$ and not more than $2000 \times 10^{10}$ atoms/cm$^2$, and the presence ratio of carbon atoms as an impurity in one main surface 12A is not less than 3 at % and not more than 25 at %.

In silicon carbide substrate 1 in the present embodiment, an inexpensive base substrate, for example, a substrate made of single-crystal silicon carbide having a high defect density, a polycrystalline silicon carbide substrate, or a base substrate made of ceramics, is adopted as base layer 11, and a substrate made of a good-quality silicon carbide single crystal (tile substrate) is arranged on base layer 11 to serve as single-crystal silicon carbide layer 12. Thus, silicon carbide substrate 1 in the present embodiment serves as a silicon carbide substrate with suppressed manufacturing cost. Further, in the present embodiment, silicon carbide substrate 1 has a structure in which a plurality of single-crystal silicon carbide layers 12 are arranged on base layer 11 with a large diameter, side by side when viewed in plan view. As a result, silicon carbide substrate 1 in the present embodiment serves as a silicon carbide substrate with suppressed manufacturing cost and with a large diameter.

In other words, silicon carbide substrate 1 in the present embodiment is a composite silicon carbide substrate formed of a strength retention portion (base layer 11) and a surface portion (tile substrates). The strength retention portion of the composite silicon carbide substrate is not required to be made of single-crystal silicon carbide as long as it has heat resistance and strength, and it is only necessary that the surface portion is made of single-crystal silicon carbide. From the viewpoint of heat resistance and strength, the strength retention portion is preferably made of silicon carbide. The silicon carbide constituting the strength retention portion may be any of a polycrystalline body produced by vapor-phase growth, a sintered body made of an inorganic or organic source material, and a monocrystalline body. Since the surface portion is epitaxially grown, it is required to be made of single-crystal silicon carbide.

Figure 9:
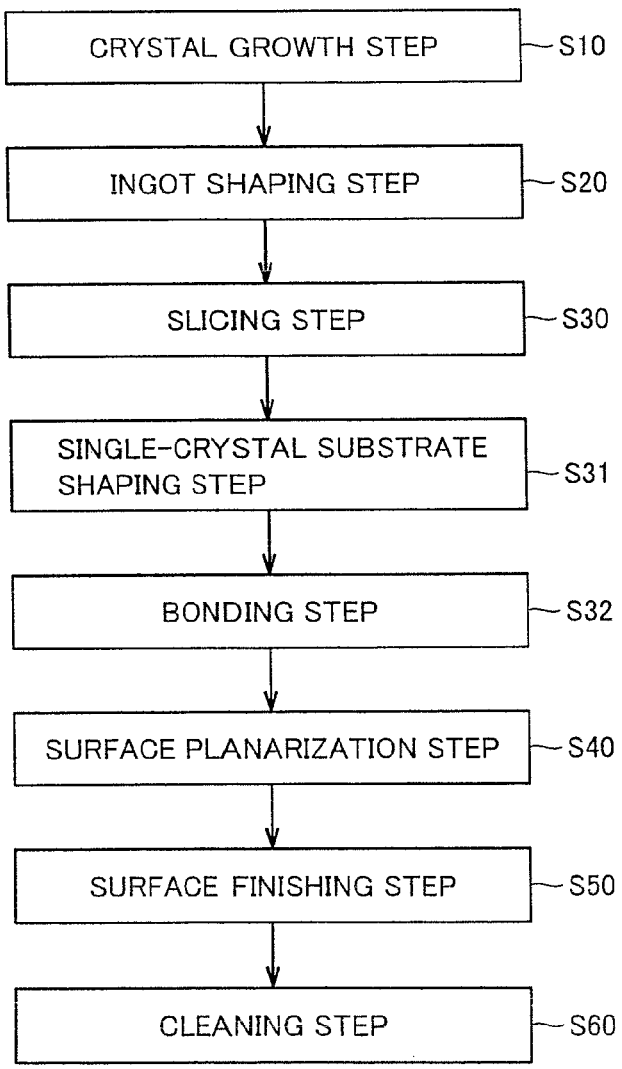
FIG. 9 is a flowchart schematically showing a method for manufacturing the silicon carbide substrate in the second embodiment.

Next, a method for manufacturing the silicon carbide substrate in the present embodiment will be described. Referring to FIG. 9, in the method for manufacturing the silicon carbide substrate in the present embodiment, first, steps (S10) to (S30) are performed as in the first embodiment. Thereafter, a single-crystal substrate shaping step is performed as step (S31). In this step (S31), a substrate obtained as a result of steps (S10) to (S30) is shaped into a shape suitable to constitute single-crystal silicon carbide layer 12 shown in FIG. 8. Specifically, for example, a plurality of rectangular substrates are prepared by shaping the substrate obtained as a result of steps (S10) to (S30). Next, a bonding step is performed as step (S32). In this step (S32), the plurality of substrates fabricated in step (S31) are arranged on a separately prepared base substrate, side by side when viewed in plan view, for example, in a matrix state. Thereafter, the substrates fabricated in step (S31) are integrated with the base substrate by being subjected to treatment of heating them to a predetermined temperature, and a structural body in which the plurality of single-crystal silicon carbide layers 12 are arranged on base layer 11, side by side when viewed in plan view, is obtained, as shown in FIG. 8.

Bonding of base layer 11 and single-crystal silicon carbide layers 12 can be performed using close-spaced sublimation or an adhesive. The adhesive may be any of organic and inorganic adhesives as long as it can retain strength. Further, as the adhesive, a polymer such as polycarbosilane containing silicon and carbon and forming SiC bonding when heated may be used.

Thereafter, steps (S40) to (S60) are performed as in the above embodiment, and thereby silicon carbide substrate 1 in the second embodiment is completed.

Since completed composite silicon carbide substrate 1 has no constraints in the orientation and size of crystal growth, a substrate with desired plane orientation and size can be obtained. Further, an inexpensive polycrystal or sintered body can be used as the base substrate. In addition, single-crystal silicon carbide layers 12 can be thinned. Thus, composite silicon carbide substrate 1 having the base substrate and single-crystal silicon carbide layers 12 bonded together can be manufactured at an inexpensive cost when compared with a single-crystal silicon carbide substrate of the same size.

Example 1

An experiment was conducted to investigate the influence of the presence ratios of sulfur atoms and carbon atoms as an impurity in a main surface of a silicon carbide substrate on yield of a semiconductor device.

A silicon carbide single crystal was grown by the sublimation method. Silicon carbide substrate 1 with a diameter of 80 mm was used as a seed substrate. The seed substrate had a main surface corresponding to a (0001) plane. A grown surface, an underlying substrate surface, and an outer periphery of the silicon carbide single crystal were ground with an outer periphery grinding machine to obtain an ingot of the silicon carbide single crystal. Slicing of the ingot was performed using a multiwire saw. The ingot was cut such that a main surface of sliced silicon carbide substrate 1 (hereinafter also referred to as a surface) would serve as a surface that was 4° off from the (0001) plane. Sliced silicon carbide substrate 1 had a thickness of 400 μm. Silicon carbide substrate 1 had a resistivity of $2\times10^5$ Ωcm. After slicing, chamfer processing was performed on an outer periphery of the substrate. The substrate subjected to the chamfer processing had a diameter of 76.2 mm. Front and back surfaces of the substrate were sequentially flattened to obtain a substrate for epitaxial growth. The back surface was subjected to grinding processing using a diamond grindstone, and thereafter subjected to polishing processing to be mirror finished such that the surface of silicon carbide substrate 1 would have an Rq of 0.3 to 10 nm. An in-feed type grinding machine was used for the grinding processing, and a vitrified bonded grindstone having a mesh size of #2400 and a concentration degree of 150 was used as the grindstone. In the polishing processing, lapping was performed. A tin surface plate was used as a surface plate. Diamond slurry had a grain size of 1 μm.

In order to process the front surface, grinding processing, lapping processing, and thereafter CMP were performed. Colloidal silica with an average grain size of 30 nm was used as abrasive grains of slurry for the CMP. In order to improve a rate and control surface composition, sulfuric acid, tartaric acid, and aqueous hydrogen peroxide were added as chemical components of the slurry. In the present invention's example, x and y were adjusted to satisfy the condition of $-50x+700 \leq y \leq -50x+1800$, where x represents a pH of the slurry, and y represents an oxidation-reduction potential.

A suede-type polishing cloth was adopted. Further, resistance coefficient R ($m^2/s$), which is represented using viscosity η (mPa·s) of a polishing liquid, liquid flow rate Q ($m^3/s$), area S ($m^2$) of a polishing surface plate, polishing pressure P (kPa), and peripheral speed V(m/s) (here, R=η×Q×V/S×P), was set to $2.0\times10^{-15}$ to $8.0\times10^{-14}$ ($m^2/s$) in the present invention's example.

To evaluate the surface composition, the amount of sulfur atoms (S) was measured by TXRF, and the amount of carbon atoms (C) as an impurity was measured by XPS. Devices were produced using substrates (sample numbers 1-1 to 1-11) with controlled surface compositions. The produced devices were used to manufacture lateral MESFETs. Yields of the MESFETs were calculated. In the calculation of the yields, a MESFET having a gate current density of $1\times10^{-6}$ A/$cm^2$ when a gate voltage of 5 V was applied thereto was determined as good. Table 1 shows results of the yields of the MESFETs manufactured by changing the presence ratios of the sulfur atoms and the carbon atoms as the impurity in the main surface of silicon carbide substrate 1.

TABLE 1

| Sample | Unit | 1-1 | 1-2 | 1-3 | 1-4 | 1-5 | 1-6 | 1-7 | 1-8 | 1-9 | 1-10 | 1-11 |
|---|---|---|---|---|---|---|---|---|---|---|---|---|
| S | ×10$^{10}$ atoms/cm$^2$ | 45 | 45 | 60 | 60 | 120 | 400 | 800 | 2000 | 2000 | 2500 | 2500 |
| C | at % | 2 | 3 | 2 | 3 | 7 | 15 | 21 | 25 | 30 | 25 | 30 |
| Device yield | % | 37 | 42 | 44 | 61 | 68 | 74 | 63 | 54 | 35 | 32 | 27 |

Sample numbers 1-4 to 1-8 are MESFETs in accordance with the present invention, and the others are MESFETs in accordance with comparative examples. In silicon carbide substrate 1 forming the MESFETs of the present invention's examples, the sulfur atoms are present in the surface of the substrate at not less than 60×10$^{10}$ atoms/cm$^2$ and not more than 2000×10$^{10}$ atoms/cm$^2$, and the carbon atoms as the impurity are present in the surface of the substrate at not less than 3 at % and not more than 25 at %. As shown in Table 1, it was confirmed that the MESFETs of the present invention's examples achieve better yields than those of the MESFETs of the comparative examples.

Example 2

An experiment was conducted to investigate the influence of the presence ratio of chlorine atoms in a main surface of a silicon carbide substrate on yield of a semiconductor device.

Surface composition was controlled by changing conditions for the CMP. In order to improve a rate and control the surface composition, sodium sulfate, sodium malate, and sodium dichloroisocyanurate were added as chemical components of slurry. Colloidal silica with an average grain size of 50 nm was used as abrasive grains of the slurry for the CMP. A suede-type polishing cloth was used. Further, in the present invention's example, resistance coefficient R (m$^2$/s) was set to a range of 3.0×10$^{-15}$ to 8.0×10$^{-15}$ (m$^2$/s). In the present invention's example, x and y were controlled to satisfy the condition of −50x+1100≤y≤−50x+1800, where x represents a pH of the slurry, and y represents an oxidation-reduction potential. Other conditions are the same as those in Example 1.

Lateral MESFETs were produced using substrates (samples 2-1 to 2-5) with controlled surface compositions, and yields of the MESFETs were calculated as in Example 1. Table 2 shows results of the yields of the MESFETs manufactured by changing the presence ratio of the chlorine atoms in the main surface of silicon carbide substrate 1.

Sample numbers 2-1 to 2-4 are MESFETs in accordance with the present invention, and sample number 2-5 is a MESFET in accordance with a comparative example. In silicon carbide substrate 1 forming the MESFETs of the present invention's examples, the chlorine atoms are present in the surface of the substrate at not more than 3000×10$^{10}$ atoms/cm$^2$. As shown in Table 2, it was confirmed that the MESFETs of the present invention's examples achieve better yields than that of the MESFET of the comparative example.

Example 3

An experiment was conducted to investigate the influence of the presence ratio of oxygen atoms in a main surface of a silicon carbide substrate on yield of a semiconductor device.

Surface composition was controlled by changing conditions for the CMP. In order to improve a rate and control the surface composition, sodium hydrogen sulfate, sodium carbonate, TMAH, and aqueous hydrogen peroxide were added as chemical components of slurry. Colloidal silica with an average grain size of 50 nm was used as abrasive grains of the slurry for the CMP. A suede-type polishing cloth was used. In the present invention's example, resistance coefficient R (m$^2$/s) was set to a range of 3.0×10$^{-15}$ to 8.0×10$^{-15}$ (m$^2$/s). In the present invention's example, x and y were controlled such that an oxidation-reduction potential satisfies the condition of −50x+700≤y≤−50x+1100, where x represents a pH of the slurry, and y represents the oxidation-reduction potential. Other conditions are the same as those in Example 1.

Lateral MESFETs were produced using substrates (samples 3-1 to 3-8) with controlled surface compositions, and yields of the MESFETs were calculated as in Example 1. Table 3 shows results of the yields of the MESFETs manufactured by changing the presence ratio of the oxygen atoms in the main surface of silicon carbide substrate 1.

TABLE 3

| Sample | Unit | 3-1 | 3-2 | 3-3 | 3-4 | 3-5 | 3-6 | 3-7 | 3-8 |
|---|---|---|---|---|---|---|---|---|---|
| S | ×10$^{10}$ atoms/cm$^2$ | 800 | 800 | 800 | 800 | 800 | 800 | 800 | 800 |
| C | at % | 22 | 22 | 22 | 22 | 22 | 22 | 22 | 22 |
| O | at % | 2 | 3 | 5 | 9 | 15 | 21 | 30 | 35 |
| Device yield | % | 60 | 63 | 65 | 69 | 68 | 64 | 62 | 58 |

TABLE 2

| Sample | Unit | 2-1 | 2-2 | 2-3 | 2-4 | 2-5 |
|---|---|---|---|---|---|---|
| S | ×10$^{10}$ atoms/cm$^2$ | 900 | 900 | 900 | 900 | 900 |
| C | at % | 20 | 20 | 20 | 20 | 20 |
| Cl | ×10$^{10}$ atoms/cm$^2$ | 100 | 900 | 1300 | 3000 | 4000 |
| Device yield | % | 69 | 66 | 64 | 62 | 57 |

Sample numbers 3-2 to 3-7 are MESFETs in accordance with the present invention's examples, and sample numbers 3-1 and 3-8 are MESFETs in accordance with comparative examples. In silicon carbide substrate 1 forming the MESFETs of the present invention's examples, the oxygen atoms are present in the surface of the substrate at not less than 3 at % and not more than 30 at %. As shown in Table 3, it was confirmed that the MESFETs of the present invention's examples achieve better yields than those of the MESFETs of the comparative examples.

Example 4

An experiment was conducted to investigate the influence of the presence ratio of a metal impurity in a main surface of a silicon carbide substrate on yield of a semiconductor device.

Surface composition was controlled by changing conditions for the CMP. In order to improve a rate and control the surface composition, sodium sulfate, sodium malate, and sodium dichloroisocyanurate were added as chemical components of slurry. Colloidal silica with an average grain size of 50 nm was used as abrasive grains of the slurry for the CMP. A suede-type polishing cloth was used. Further, in the present invention's example, resistance coefficient R ($m^2/s$) was set to a range of $3.0 \times 10^{-15}$ to $8.0 \times 10^{-15}$ ($m^2/s$). In the present invention's example, x and y were controlled such that an oxidation-reduction potential satisfies the condition of $-50x+1100 \leq y \leq -50x+1800$, where x represents a pH of the slurry, and y represents the oxidation-reduction potential. Other conditions are the same as those in Example 1.

Lateral MESFETs were produced using substrates (samples 4-1 to 4-5) with controlled surface compositions, and yields of the MESFETs were calculated as in Example 1. Table 4 shows results of the yields of the MESFETs manufactured by changing the presence ratio of the metal impurity in the main surface of silicon carbide substrate 1.

TABLE 4

| Sample | Unit | 4-1 | 4-2 | 4-3 | 4-4 | 4-5 |
|---|---|---|---|---|---|---|
| S | $\times 10^{10}$ atoms/$cm^2$ | 70 | 70 | 70 | 70 | 70 |
| C | at % | 3 | 3 | 3 | 3 | 3 |
| Metal | $\times 10^{10}$ atoms/$cm^2$ | 9 | 80 | 900 | 4000 | 5000 |
| Device yield | % | 70 | 67 | 66 | 64 | 62 |

Sample numbers 4-1 to 4-4 are MESFETs in accordance with the present invention's examples, and sample number 4-5 is a MESFET in accordance with a comparative example. In silicon carbide substrate 1 forming the MESFETs of the present invention's examples, the metal impurity is present in the surface of the substrate at not more than $4000 \times 10^{10}$ atoms/$cm^2$. As shown in Table 4, it was confirmed that the MESFETs of the present invention's examples achieve better yields than that of the MESFET of the comparative example.

Example 5

An experiment was conducted to investigate the influence of a surface roughness of a main surface of a silicon carbide substrate on yield of a semiconductor device.

In the present example, a silicon carbide substrate with a diameter of 125 mm was used. Surface composition was controlled by changing conditions for the CMP. Colloidal silica with an average grain size of 20 to 100 nm was used as abrasive grains of slurry for the CMP. A suede-type polishing cloth was used. Further, in the present invention's example, resistance coefficient R ($m^2/s$) was set to $2.0 \times 10^{-15}$ to $5.0 \times 10^{-15}$ ($m^2/s$). In the present invention's example, x and y were adjusted to satisfy the condition of $-50x+700 \leq y \leq -50x+1100$, where x represents a pH of the slurry, and y represents an oxidation-reduction potential. Other conditions are the same as those in Example 1.

Lateral MESFETs were produced using substrates (samples 5-1 to 5-4) with controlled surface compositions, and yields of the MESFETs were calculated as in Example 1. Table 5 shows results of the yields of the MESFETs manufactured by changing the surface roughness of the main surface of silicon carbide substrate 1.

TABLE 5

| Sample | Unit | 5-1 | 5-2 | 5-3 | 5-4 |
|---|---|---|---|---|---|
| S | $\times 10^{10}$ atoms/$cm^2$ | 60 | 60 | 60 | 60 |
| O | at % | 4 | 4 | 4 | 4 |
| Roughness | nm | 0.1 | 0.3 | 0.5 | 1 |
| Device yield | % | 71 | 70 | 68 | 64 |

Sample numbers 5-1 to 5-3 are MESFETs in accordance with the present invention's examples, and sample number 5-4 is a MESFET in accordance with a comparative example. In silicon carbide substrate 1 forming the MESFETs of the present invention's examples, the surface of the substrate has a surface roughness of not more than 0.5 nm when evaluated in Rq. As shown in Table 5, it was confirmed that the MESFETs of the present invention's examples achieve better yields than that of the MESFET of the comparative example.

Example 6

An experiment was conducted to investigate the influence of a plane orientation of a main surface of a silicon carbide substrate on yield of a semiconductor device.

A substrate was fabricated to have a main surface corresponding to the (000-1) plane. The single-crystal substrate had a diameter of 110 mm. In order to control surface composition and roughness to be within appropriate ranges, colloidal silica with a grain size of 10 nm was used, and resistance coefficient R ($m^2/s$) in the present invention's example was set to $5.0 \times 10^{-14}$ to $8.0 \times 10^{-14}$ ($m^2/s$). In the present invention's example, x and y were controlled such that an oxidation-reduction potential satisfies the condition of $-50x+700 \leq y \leq -50x+1000$, where x represents a pH of slurry, and y represents the oxidation-reduction potential. Other conditions are the same as those in Example 1. MESFETs were produced using silicon carbide substrate 1 having the main surface corresponding to the (000-1) plane.

Table 6 shows results thereof. Sample numbers 6-3 to 6-8 are MESFETs in accordance with the present invention's examples, and the others are MESFETs in accordance with comparative examples. It was confirmed that the MESFETs of the present invention's examples, which use silicon carbide substrate 1 having a surface in which the sulfur atoms are present at not less than $60 \times 10^{10}$ atoms/$cm^2$ and not more than $2000 \times 10^{10}$ atoms/$cm^2$, and the carbon atoms as the impurity are present at not less than 3 at % and not more than 25 at %, achieve better yields than those of the MESFETs using substrates having surface compositions of the comparative examples.

TABLE 6

| Sample | Unit | 6-1 | 6-2 | 6-3 | 6-4 | 6-5 | 6-6 | 6-7 | 6-8 | 6-9 | 6-10 |
|---|---|---|---|---|---|---|---|---|---|---|---|
| S | $\times 10^{10}$ atoms/$cm^2$ | 40 | 60 | 60 | 80 | 120 | 600 | 800 | 2000 | 2000 | 2700 |
| C | at % | 3 | 2 | 3 | 7 | 10 | 18 | 21 | 25 | 29 | 25 |
| Device yield | % | 41 | 45 | 60 | 62 | 70 | 71 | 64 | 53 | 32 | 36 |

Example 7

An experiment was conducted to investigate the influence of a plane orientation of a main surface of a silicon carbide substrate on yield of a semiconductor device.

A silicon carbide single crystal was grown by the sublimation method. A silicon carbide substrate with a diameter of 80 mm was used as a seed substrate. The seed substrate had a main surface corresponding to the (0001) plane. A grown surface, an underlying substrate surface, and an outer periphery of the silicon carbide single crystal were ground with an outer periphery grinding machine to obtain an ingot of silicon carbide. Slicing was performed using a multiwire saw. In order to obtain a sliced substrate surface corresponding to {03-38}, the ingot was set in a wire saw apparatus with being tilted by 54.7° from a running direction of a wire, and was cut. A sliced substrate had a thickness of 250 μm. An outer periphery of the sliced substrate was diced to obtain tile substrates of 20 mm×30 mm.

Polycrystalline silicon carbide was grown by the sublimation method. An ingot with a diameter of 155 mm was obtained by outer periphery processing. The ingot was sliced with a multiwire saw to obtain a polycrystalline substrate with a thickness of 500 μm. The rectangular single-crystal substrates were arranged on the polycrystalline underlying substrate, and bonded by close-spaced sublimation. An outer periphery of the bonded composite substrate was processed to obtain a substrate with a diameter of 150 mm and a thickness of 750 μm. In the present invention's example, x and y were adjusted to satisfy the condition of $-50x+700 \leq y \leq -50x+1100$, where x represents a pH of slurry, and y represents an oxidation-reduction potential. Further, in the present invention's example, resistance coefficient R ($m^2/s$) was set to $5.0 \times 10^{-15}$ to $1.0 \times 10^{-14}$ ($m^2/s$).

Other conditions are the same as those in Example 1. MESFETs were produced using silicon carbide substrate 1 having the main surface corresponding to the (03-38) plane.

Table 7 shows results thereof. Sample numbers 7-2 to 7-5 are MESFETs in accordance with the present invention's examples, and the others are MESFETs in accordance with comparative examples. It was confirmed that the MESFETs of the present invention's examples, which use silicon carbide substrate 1 having a surface in which the sulfur atoms are present at not less than $60 \times 10^{10}$ atoms/cm$^2$ and not more than $2000 \times 10^{10}$ atoms/cm$^2$, and the carbon atoms as the impurity are present at not less than 3 at % and not more than 25 at %, achieve better yields than those of the MESFETs using substrates having surface compositions of the comparative examples.

TABLE 7

| Sample | Unit | 7-1 | 7-2 | 7-3 | 7-4 | 7-5 | 7-6 |
|---|---|---|---|---|---|---|---|
| S | ×10$^{10}$ atoms/cm$^2$ | 40 | 60 | 300 | 500 | 2000 | 2600 |
| C | at % | 2 | 3 | 12 | 16 | 25 | 30 |
| Device yield | % | 36 | 62 | 75 | 73 | 55 | 31 |

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide substrate, comprising:
    a first main surface; and
    a second main surface opposite to said first main surface,
    a region including at least one main surface of said first and second main surfaces consisting essentially of single-crystal silicon carbide,
    sulfur atoms being present in said one main surface at not less than $60 \times 10^{10}$ atoms/cm$^2$ and not more than $2000 \times 10^{10}$ atoms/cm$^2$, and carbon atoms as an impurity being present in said one main surface at not less than 3 atomic percent (at %) and not more than 25 atomic percent (at %).

2. The silicon carbide substrate according to claim 1, wherein chlorine atoms are present in said one main surface at not more than $3000 \times 10^{10}$ atoms/cm$^2$.

3. The silicon carbide substrate according to claim 1, wherein oxygen atoms are present in said one main surface at not less than 3 atomic percent (at %) and not more than 30 atomic percent (at %).

4. The silicon carbide substrate according to claim 1, wherein a metal impurity is present in said one main surface at not more than $4000 \times 10^{10}$ atoms/cm$^2$.

5. The silicon carbide substrate according to claim 1, wherein said one main surface has a surface roughness of not more than 0.5 nm when evaluated in Rq.

6. The silicon carbide substrate according to claim 1, having a diameter of not less than 110 mm.

7. The silicon carbide substrate according to claim 1, having a diameter of not less than 125 mm and not more than 300 mm.

8. The silicon carbide substrate according to claim 1, wherein
    said single-crystal silicon carbide has a 4H structure, and
    said one main surface has an off angle of not less than 0.1° and not more than 10° relative to a {0001} plane of said single-crystal silicon carbide.

9. The silicon carbide substrate according to claim 1, wherein
    said single-crystal silicon carbide has a 4H structure, and
    said one main surface has an off angle of not more than 4° relative to a {03-38} plane of said single-crystal silicon carbide.

10. The silicon carbide substrate according to claim 1, comprising:
    a base layer; and
    a single-crystal silicon carbide layer formed on said base layer,
    wherein said one main surface is a surface of said single-crystal silicon carbide layer on a side opposite to a side facing said base layer.

11. The silicon carbide substrate according to claim 1, wherein each concentration of sulfur atoms and carbon atoms is adjusted so that silicon is suppressed from adhering to said one main surface.

* * * * *